United States Patent [19]

Irwin et al.

[11] Patent Number: 4,952,889
[45] Date of Patent: Aug. 28, 1990

[54] LOOP FILTER MODULATED SYNTHESIZER

[75] Inventors: James S. Irwin, Bastrop, Tex.; Wayne P. Shepherd, Sunrise, Fla.

[73] Assignee: Motorola, Inc., Schaumburg, Ill.

[21] Appl. No.: 344,640

[22] Filed: Apr. 28, 1989

[51] Int. Cl.[5] .......................... H03C 3/09; H03L 7/093
[52] U.S. Cl. ...................................... 332/128; 331/23; 332/144; 455/113; 455/119
[58] Field of Search ............... 332/127, 128, 144, 146; 331/23; 455/42, 75, 76, 113, 119

[56] References Cited

U.S. PATENT DOCUMENTS

| 4,052,672 | 10/1977 | Enderby et al. | 332/144 |
| 4,559,505 | 12/1985 | Suarez et al. | 331/1 A |
| 4,649,353 | 3/1987 | Sonnenberg | 331/8 |
| 4,755,774 | 7/1988 | Heck | 332/18 |

OTHER PUBLICATIONS

Gardner, Phaselock Techniques 2nd Edition, 1979, pp. 166 and 167.

Primary Examiner—Siegfried H. Grimm
Attorney, Agent, or Firm—Juliana Agon; Daniel K. Nichols

[57] ABSTRACT

A frequency synthesizer for providing a modulated output signal includes a phase comparator, a loop filter, and a voltage controlled oscillator (VCO). The phase comparator receives a reference input signal and a signal related to the VCO output, and generates a control current. A modulation circuit receives a modulation signal and provides both a modulation current and a modulation voltage. The modulation current is summed with the control current at one input of the loop filter, while the modulation voltage is applied to a second input of the loop filter. The VCO is controlled by the output of the loop filter to produce the modulated output signal.

13 Claims, 2 Drawing Sheets

LOOP FILTER MODULATED SYNTHESIZER

TECHNICAL FIELD

This invention relates generally to modulated frequency synthesizers, and more particularly to two port modulated phase-locked loop frequency synthesizers.

BACKGROUND ART

Various approaches of dual port modulation of a frequency synthesizer loop are utilized to obtain a flat frequency response. Dual port modulation involves appropriately adding modulating signals to the phase-locked loop (PLL) to achieve balanced high-pass and low-pass responses. Together, these responses result in uniform modulation below, through and above the loop unity gain frequency of the phase-locked loop.

The most fundamental method of dual port modulation requires simultaneous modulation of the reference oscillator and the voltage controlled oscillator (VCO). One arrangement feeds the modulating signal in both at the VCO and ahead of the phase comparator. An implementation more readily integratable has a phase modulation circuit in the reference path of the phase comparator and a modulated VCO.

However, this method may be inappropriate or difficult to achieve in some applications. For example, the reference oscillator can not be modulated if a high stability crystal oscillator is used. If the goal is to add modulation to a currently available PLL, that integrated circuit may not have the phase modulator built-in already or the required terminals accessible for modulation. Since modulation is in the reference path of the phase comparator, the phase modulator can not be completely disabled if modulation is no longer wanted.

Another method applies modulation to both the input of a voltage controlled oscillator (VCO) and, through a summing voltage network, to the output of a phase detector. Although this method can achieve wide deviation capability for a modulating signal, "balancing" (each modulation port must provide the same magnitude of deviation sensitivity and in the same direction in order to maintain the flat overall response) between the two ports is hard to achieve due to variations in components' sensitivities to temperature and time delays (thereby increasing cost).

Accordingly, there exists a need for a modulation arrangement for a phase-locked loop frequency synthesizer which is capable of wide deviation while minimizing cost and components by having modulation added-on.

SUMMARY OF THE INVENTION

Accordingly, it is an object of the present invention to apply dual port modulation to dual inputs of a loop filter to add-on modulation to an existing synthesizer.

Briefly, according to the invention, a frequency synthesizer with a modulated output signal is provided. This synthesizer includes a phase comparator and a modulation network for providing an output current. The modulation network further includes an input for receiving a modulation signal, a voltage to current converter for providing a varying current in response to the modulation signal which is summed with the output current of the phase comparator.

DETAILED DESCRIPTION OF THE PREFERRED EMBODIMENT

Figure 1:
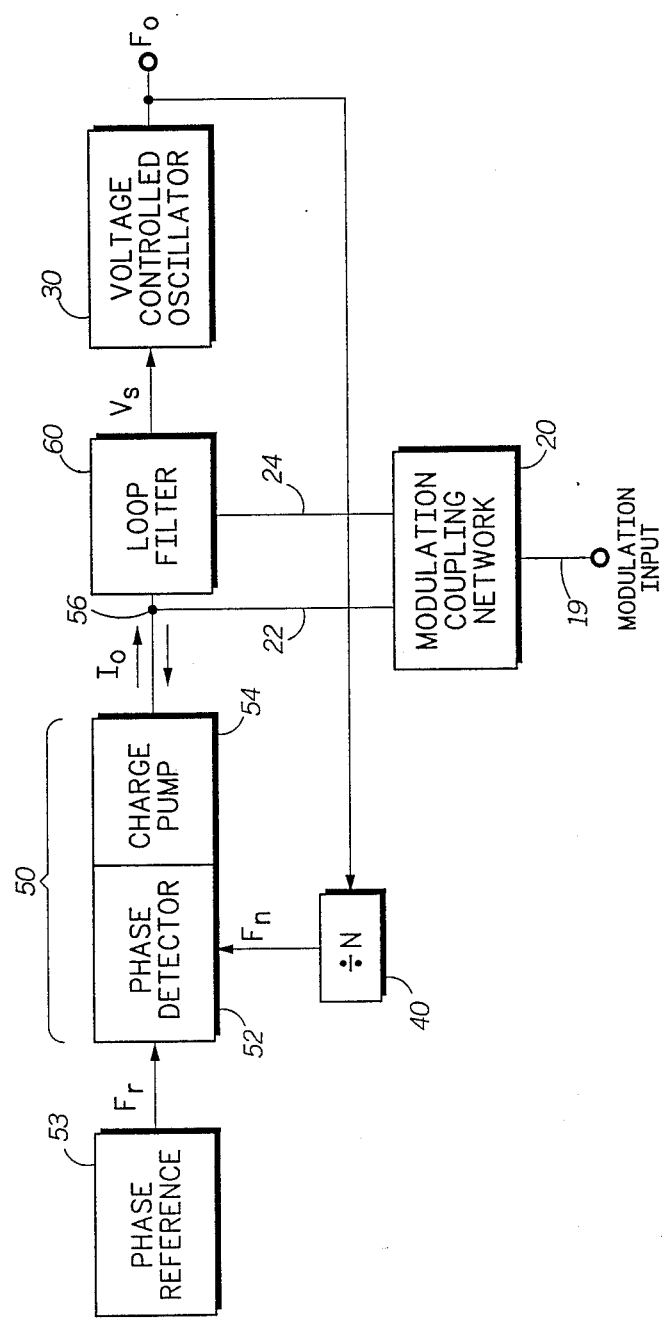
FIG. 1 is a block diagram of a phase-locked loop in accordance with the present invention.

As illustrated in FIG. 1, frequency synthesizers commonly employ standard phase-locked loop circuitry wherein a Voltage Controlled Oscillator (VCO 30) signal $F_o$ is divided by a loop divider 40 having a divisor N. The output of the loop divider $F_n$ is compared to a reference frequency signal $F_r$ in a phase detector or phase comparator 50. In the preferred embodiment, the phase detector 50 is a tri-state phase detector 52 and charge pump 54 of the type generally described in Motorola Semiconductor Products' MC43440 literature, 1972. Implemented separately, the tri-state phase detector 52 may be a Motorola part MC14046 with a standard charge pump 54.

The charge pump 54 generates a charging or loop correction current $I_o$ whose duration is proportional to the phase difference detected. The charge pump 54 generates a charging or discharging current $I_o$ and supplies it to the capacitive elements of a loop filter 60 in response to the up and down pulses received from the phase detector 52. The charging current $I_o$ is utilized to charge capacitive elements in the loop filter 60, thereby developing a steering line control voltage $V_s$ for the Voltage Controlled Oscillator (VCO 30). Further, the filter 60 assists in maintaining the synthesized frequency $F_o$. The combination of resistive and capacitive elements in the loop filter 60 provide a filtering time constant by which sporadic disturbances or perturbations are suppressed. The result is that the phase-locked loop operates to acquire, and then maintain, the Voltage Controlled Oscillator (VCO 30) frequency as an integral multiple (N) of a reference frequency $F_r$. Thus, a synthesized frequency $F_o$ is generated by the Voltage Controlled Oscillator (VCO 30) and is proportional to the control voltage on its input Vs.

In order to generate one of a number of desired synthesized frequencies, the synthesized frequency $F_o$ is scaled by a divisor N. The divisor N is chosen to correspond to the desired synthesized frequency. In order to change the desired synthesized frequency, it is well known in the art to provide a programmable divider 40.

To lock to the new frequency, the scaled synthesized frequency $F_n$ is compared to a reference frequency signal $F_r$ in the phase detector 52. The reference frequency $F_r$ can be provided by any suitable frequency generator such as an oscillator or phase reference 53. The phase detector 52 generates signals indicative of the phase relationship between the reference frequency $F_r$ and the scaled, synthesized frequency $F_n$.

To add modulation to the phase-lock loop, a modulation coupling network 20, having a modulation input 19 for a modulating signal is coupled to two inputs of the loop filter at lines 22 and 24.

Figure 2:
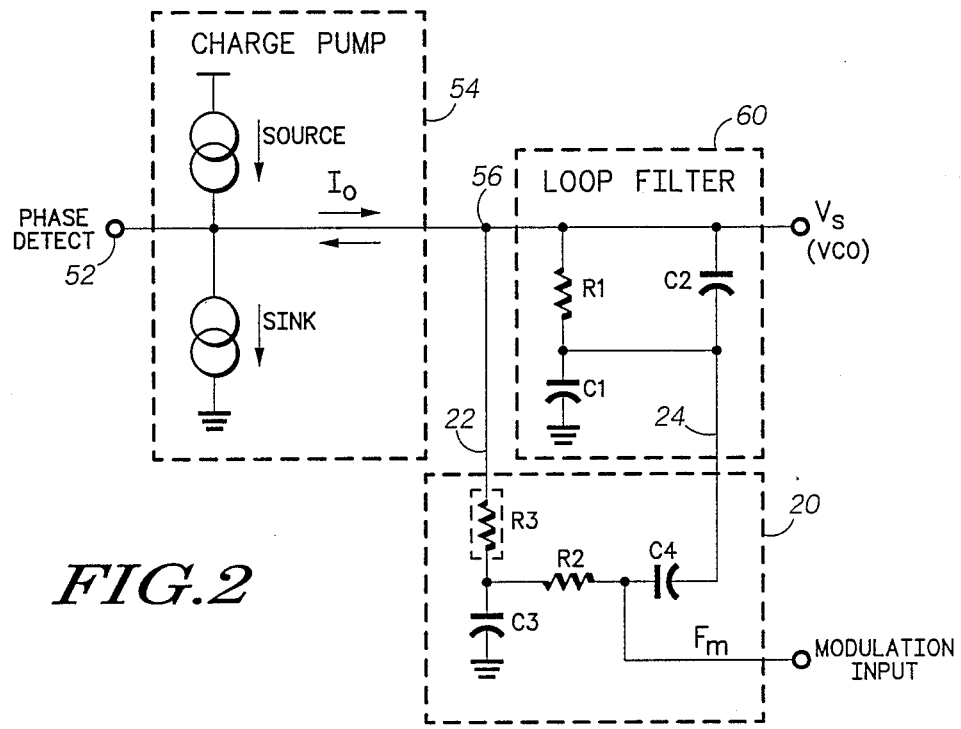
FIG. 2 is a preferred embodiment of the modulation coupling network of FIG. 1.

Referring to FIG. 2, the charge pump 54 can be symbolically represented as a current source and a current sink switched by the phase detector 52. The current source is provided for charging a plurality of capacitive elements C1 and C2 of the loop filter 60 and thereby generate a steering line voltage control signal $V_s$ for the Voltage Controlled Oscillator (VCO 30) when the synthesized frequency $F_o$ must be brought up from its current frequency. Similarly, the current sink is provided to discharge the capacitive elements C1 and C2 of the loop filter 60 to reduce the steering line voltage control signal $V_s$, when the synthesized frequency $F_o$ must be brought down from its current value.

The charge pump 54 provides the control signal $V_s$ to the VCO 30 via the loop filter 60, which is a conventional two pole filter with a parallel combination of resistor R1 and capacitor C2 coupled to ground by C1. The modulating signal $F_m$ is coupled to the loop filter at its inputs 22 and 24 via the modulation coupling network 20. Connected to the modulation input 19 on one side is an integrator. The integrator comprises a resistor R2 connected to the modulation input 19 on one end and coupled to ground by C3. A voltage to current convertor is coupled to the junction of the R2 and capacitor C3. The convertor may be a simple resistor R3 (in series with a DC blocking capacitor, if needed) which feeds line 22 into the loop filter 60 at a summing node 56. Connected to the modulation input 19 on the other side of the modulation coupling network 20 is a coupling capacitor C4 which feeds the loop filter 60 via line 24. In addition, this combination of the capacitors C4 and C1 form a voltage divider to feed in the signal at line 24 to the loop filter 60.

Figure 3:
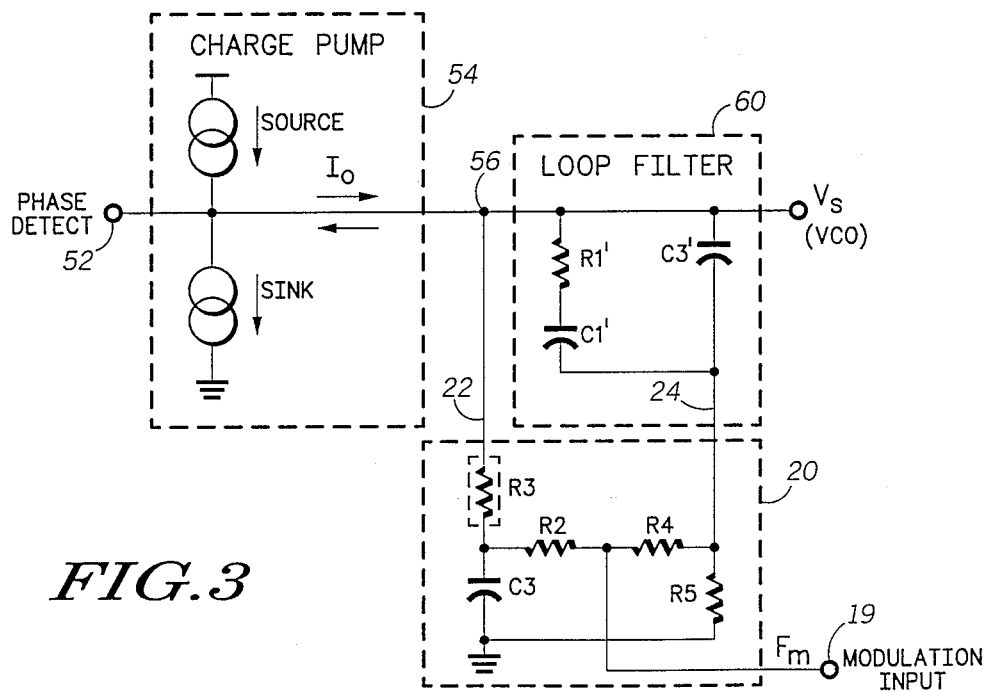
FIG. 3 is an alternate embodiment of the modulation coupling network of FIG. 1.

Referring to FIG. 3, which shows an alternate embodiment of the present invention, the loop filter 60 is modified. From a parallel combination of resistor and capacitor coupled to a grounded series capacitor, the loop filter 60 is changed to a configuration where a resistor R1' is in series with a capacitor C1', all of which is connected in parallel with a capacitor C3'. The voltage divider in this case is formed by resistors R4 and R5 connected in series with the resistor R5 grounded on one end. Via line 24, resistors R4 and R5 are connected to the capacitors C1' and C3'.

Various changes or modifications are possible to those skilled in the art; for example a more complicated circuitry other than a resistor R3 (in series with a DC capacitor, if needed) may be used for the current voltage convertor. In addition, the voltage divider may be implemented with varactors.

Operationally, for modulating signals above the unity gain corner of the phase-locked loop 60, the filter is lifted off ground through a series impedance R5 and the modulating signal is fed through a second impedance R4 which forms a voltage divider together with the resistor R5. Both impedances need not necessarily be resistors. As shown in FIG. 2, the voltage divider may be implemented by the capacitors, C4 and C1.

For modulating signals below the unity gain of the phaselocked loop 60, but greater than DC, the modulation frequency signal is fed through an integrator to obtain phase information from the frequency signal. The voltage to current convertor R3 converts this phase information into a varying current. The resultant current allows the phase detector 54 to adjust the charge pump 54 in response to the modulation received to provide a modulated output signal. Since both the loop correction current ($I_o$) and the modulation current (22) are provided to the same filter (60), inherent balance results. As long as the loop response is maintained, the modulation response will also be maintained.

What is claimed is:

1. A frequency synthesizer for providing a modulated output signal, comprising:
    a filter having an output for controlling a voltage controlled oscillator (VCO) to produce said modulated output signal;
    a phase comparator means for providing an output current to said filter,
    said phase comparator means having a first input for a reference signal and a second input for a signal derived from said modulated output signal;
    first modulation input means including an input for receiving a modulation signal, means for providing a varying current to said filter in response to said modulation signal, and means for summing said varying current and said output current of said phase comparator means in said filter; and
    second modulation input means for applying a varying voltage to said filter in response to said modulation signal.

2. The frequency synthesizer of claim 1 wherein said means for providing said varying current comprises:
    an integrator means for providing a phase signal in response to said modulation signal; and
    voltage conversion means for providing said varying current in response to said phase signal.

3. The frequency synthesizer of claim 1 wherein said summing means comprises said filter being a loop filter including an input for summing said varying current and said output current of said phase comparator means.

4. The frequency synthesizer of claim 1 wherein said phase comparator means comprises a charge pump type of phase detector.

5. The frequency synthesizer of claim 1 wherein said means for providing said varying current is responsive to a low frequency portion of said modulation signal.

6. A frequency synthesizer, comprising:
    a passive loop filter having an output for controlling a voltage controlled oscillator (VCO) to produce a modulated output signal;
    a phase comparator for providing a control current to an input of said passive loop filter,
    said phase comparator having a first input for a reference signal and a second input for a signal derived from said modulated output signal; and
    said passive loop filter including a modulation input for receiving a modulation signal, means for converting said control current to a voltage signal, and means for summing said modulation signal with said voltage signal, said summing means being coupled to said modulation input.

7. The frequency synthesizer of claim 6 wherein said summing means comprises a voltage divider for summing a voltage portion of said modulation signal into said passive loop filter.

8. A frequency synthesizer including a phase comparator and a loop filter, comprising:
    said loop filter having an output for controlling a voltage controlled oscillator (VCO) to produce a modulated output signal;
    said phase comparator for providing a control current to an input of said loop filter,
    said phase comparator having a first input for a reference signal and a second input for signal derived from said modulated output signal; and
    said loop filter including a modulation input for receiving a modulation signal, means for converting said control current to a voltage signal, and a voltage divider comprising a plurality of capacitors coupled to said modulation input for summing a voltage portion of said modulation signal into said loop filter.

9. The frequency synthesizer of claim 7 wherein said voltage divider comprises a plurality of resistors.

10. A frequency synthesizer including a phase comparator and an ungrounded loop filter, comprising:
    said loop filter having an output for controlling a voltage controlled oscillator (VCO) to produce a modulated output signal;
    said phase comparator for providing a control current to an input of said ungrounded loop filter,
    said phase comparator having a first input for a reference signal and a second input for a signal derived from said modulated output signal; and
    said ungrounded loop filter including a modulation input for receiving a modulation signal, means for converting said control current to a voltage signal, and means for summing said modulation signal with said voltage signal, said summing means being coupled to said modulation input.

11. The frequency synthesizer of claim 7 wherein said voltage divider includes at least a component of said loop filter.

12. The frequency synthesizer of claim 6 wherein said summing means comprises passive elements.

13. A frequency synthesizer for providing a modulated output signal, comprising:
    a phase comparator means for providing a control current to an input of a loop filter,
    said phase comparator means having a first input for a reference signal and a second input for a signal derived from said modulated output signal; and
    said loop filter including
    an output for controlling a voltage controlled oscillator (VCO) to produce said modulated output signal,
    a modulation input for receiving a modulation signal,
    means for converting said control current to a voltage signal,
    means for summing said modulation signal with said voltage signal, said summing means being coupled to said modulation input,
    means for providing a varying current in response to said modulation signal coupled to said modulation input and
    means for summing said varying current and said control current from said phase comparator means at said loop filter input.

* * * * *